United States Patent [19]

Nagakubo et al.

[11] Patent Number: 4,478,655
[45] Date of Patent: Oct. 23, 1984

[54] METHOD FOR MANUFACTURING SEMICONDUCTOR DEVICE

[75] Inventors: Yoshihide Nagakubo, Kawasaki; Hiroshi Momose, Yokohama, both of Japan

[73] Assignee: Tokyo Shibaura Denki Kabushiki Kaisha, Japan

[21] Appl. No.: 434,311

[22] Filed: Sep. 30, 1982

[30] Foreign Application Priority Data

Dec. 10, 1981 [JP] Japan .................... 56-198862

[51] Int. Cl.$^3$ ............................. H01L 21/20
[52] U.S. Cl. .................... 148/175; 29/576 W; 29/578; 156/648
[58] Field of Search ............ 29/576 R, 576 W, 578, 29/571; 148/175; 156/648, 649

[56] References Cited

U.S. PATENT DOCUMENTS

| | | | |
|---|---|---|---|
| 3,859,127 | 1/1975 | Lehner | 156/648 |
| 4,234,362 | 11/1980 | Riseman | 29/571 |
| 4,272,308 | 6/1981 | Varshney | 29/576 W |
| 4,274,909 | 6/1981 | Venkataraman et al. | 29/578 |
| 4,390,393 | 6/1983 | Ghezzo et al. | 156/649 |

Primary Examiner—L. Dewayne Rutledge
Assistant Examiner—S. Kastler
Attorney, Agent, or Firm—Finnegan, Henderson, Farabow, Garrett & Dunner

[57] ABSTRACT

The invention provides a method for manufacturing a semiconductor device, having the steps of: forming a first mask pattern on a semiconductor layer through an SiO$_2$ film; forming a thin layer on at least side surfaces of the first mask pattern; selectively forming a second mask pattern on an SiO$_2$ film portion located between the thin layer portions formed on the side surface of the first mask pattern; selectively etching the thin layer portions formed on the at least side surfaces of the first mask pattern, and the SiO$_2$ film portions under the thin layer portions formed on the side surfaces of the first mask pattern, using the first and second mask patterns; selectively etching an exposed portion of the semiconductor layer to form a trench; and forming an element isolation region by burying an insulating material in the trench.

20 Claims, 31 Drawing Figures

METHOD FOR MANUFACTURING SEMICONDUCTOR DEVICE

BACKGROUND OF THE INVENTION

The present invention relates to a method for manufacturing a semiconductor device in which the element isolation technique is improved.

A semiconductor device, especially, a complementary MOS transistor (CMOS transistor) has a structure in which an n-channel MOS transistor is formed in the surface layer of a p-type island well region of an n-type semiconductor substrate, and a p-channel MOS transistor is formed in part of a substrate surface excluding the p-type well region. The semiconductor integrated circuit including such a CMOS transistor has electrical characteristics, such as power consumption, that are better than those of a semiconductor integrated circuit which includes MOS transistors of a single channel.

Conventional CMOS integrated circuit (CMOS-IC) and a conventional CMOS large scale integration (CMOS-LSI) have structures in which n- and p-channel MOS transistors are isolated by a dielectric material, as shown in FIG. 1. The CMOS-IC and CMOS-LSI are manufactured by the following method.

After a p-type well region 2 is selectively formed in an n-type semiconductor substrate 1, a field oxide film 3 is selectively formed by the Locos method to isolate elements. Gate electrodes $5_1$ and $5_2$ of impurity-doped polycrystalline silicon are formed on gate oxide films $4_1$ and $4_2$ on island surface regions of the semiconductor substrate 1 and the p-type well region 2 which are isolated by the field oxide film 3. Subsequently, a p-type impurity is diffused in the island region of the semiconductor substrate 1 using a photoresist pattern (not shown) and the gate electrode $5_1$ as a mask to form $p^+$-type regions 6 which function as the source and the drain. An n-type impurity is then diffused using a photoresist pattern (not shown) and the gate electrode $5_2$ and a mask to form $n^+$-type regions 7 which function as the source and the drain. A CVD-$SiO_2$ film 8 is formed to cover the entire surface and contact holes 9 are formed in the CVD-$SiO_2$ film 8. Aluminum electrodes 10 are then deposited in the contact holes 9 so as to contact the $p^+$-type regions 6 and the $n^+$-type regions 7. Thus, a CMOS-IC or CMOS-LSI is prepared.

In the CMOS-IC shown in FIG. 1, the Locos method for forming the field oxide film as the element isolation region results in great patterning error, so that it cannot be applied to prepare a highly integrated semiconductor device. Although the CMOS requires only a small power consumption, since the p-type well region 2 is formed in the n-type semiconductor substrate 1, a parasitic pnp transistor is formed which has the $p^+$-type regions 6 of the p-channel MOS transistor as the emitter, the n-type semiconductor substrate 1 as the base, and the p-type well region 2 as the collector, and at the same time, a parasitic npn transistor is formed which has the $n^+$-type regions 7 of the n-channel MOS transistor as the emitter, the p-type well region 2 as the base, and the n-type semiconductor substrate as the collector. A thyristor constituted by the parasitic transistors causes the latch-up phenomenon. In the CMOS-IC shown in FIG. 1, the field oxide film 3 which has a width of more than about 12 μm is formed in a portion indicated by a length L between the $p^+$-type region 6 and the $n^+$-type region 7 adjacent thereto. In the CMOS-IC and the like, the element micronization and hence the high packing density of the device are limited if the latch-up phenomenon is to be prevented.

SUMMARY OF THE INVENTION

It is an object of the present invention to provide a method for manufacturing a semiconductor device, wherein a trench (element isolation region) which has a predetermined depth and which has an insulating material buried therein can be selectively formed in submicron dimensions at the interface between a semiconductor substrate or a semiconductor layer and a well region to achieve a high packing density.

In order to achieve the above object of the present invention, there is provided a method for manufacturing a semiconductor device, comprising the steps of:

forming a $SiO_2$ film on a semiconductor layer;

laying down a first mask pattern on the $SiO_2$ film;

using the first mask pattern, ion-implanting in the semiconductor layer an impurity of the conductivity type opposite to that of the semiconductor layer to form an ion injection layer of a conductivity type opposite to that of the semiconductor layer;

forming a thin layer on at least the side surfaces of the first mask pattern;

selectively forming a second mask pattern on the portion of the $SiO_2$ film located between, and abutting, portions of the thin layer formed on the side surfaces of the first mask pattern, the material of said thin layer being different from the materials of said first and second mask patterns;

selectively etching the portions of the thin layer formed on at least the side surfaces of the first mask pattern and lying between said first and second mask patterns and the portion of the $SiO_2$ film underlying the latter portions of the thin layer to expose said semiconductor layer;

selectively etching the exposed portion of the semiconductor layer to form a trench;

forming an element isolation region by burying an insulating material in the trench;

annealing the semiconductor layer to diffuse the impurity from the ion injection layer and thereby forming a well region which has a conductivity type opposite to that of the semiconductor layer and which has a depth smaller than the depth of the element isolation region in that portion of the semiconductor layer isolated by the element region;

forming an element on the well region; and wiring the element for connection.

DETAILED DESCRIPTION OF THE PREFERRED EMBODIMENTS

Figure 1:
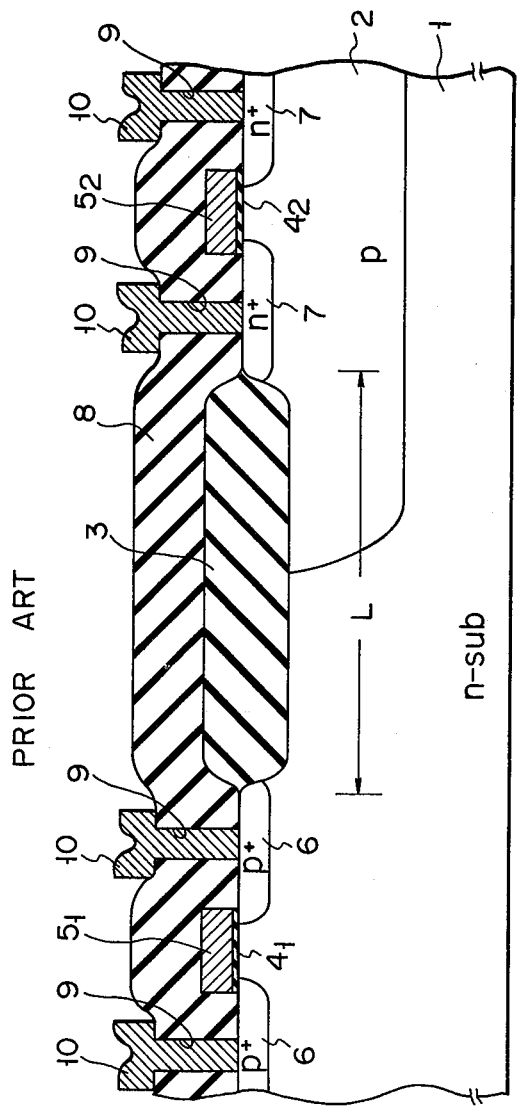
FIG. 1 is a sectional view showing part of a conventional CMOS-IC.

A first mask pattern is formed on a semiconductor layer through an $SiO_2$ film. The semiconductor layer is a semiconductor substrate, an epitaxial layer which is formed on a semiconductor substrate of the conductivity type same to that of said epitaxial layer or an epitaxial layer which is formed on an insulating substrate (e.g., sapphire substrate). The $SiO_2$ film may comprise a thermal oxide film or a CVD-$SiO_2$ film. The material of the first mask pattern may be selected from polycrystalline silicon, amorphous silicon, $SiO_2$, $Si_3N_4$ and a metal such as aluminum. For manufacturing a CMOS-IC or a CMOS-LSI, an impurity of a conductivity type opposite to that of said semiconductor layer may be ion-implanted in the semiconductor layer to form a well region, using the first mask pattern.

A thin layer is formed on at least side surfaces of the first mask pattern. The material of the thin layer must be a material which is selectively etched using the first and second mask patterns as masks. The material may be selected from $SiO_2$, $Si_3N_4$, polycrystalline silicon and amorphous silicon, but must be different from that of the first and second mask patterns. Especially, when the first mask pattern comprises polycrystalline silicon or amorphous silicon, the thin layer of $SiO_2$ may be formed by thermal oxidation on at least side surfaces of the first mask pattern.

A second mask pattern is selectively formed on the $SiO_2$ film portion positioned between the thin layer portions on the side surfaces of the first mask pattern. The material of the second mask pattern may be selected from a photoresist or polycrystalline silicon. In order to form the second mask pattern by a material (e.g., photoresist), a photoresist film is coated to cover the entire surface and is selectively etched to obtain a photoresist pattern. A typical combination of the first and second masks and the thin layer may be such that the first mask pattern comprises polycrystalline silicon (or amorphous silicon), the thin layer comprises $SiO_2$, and the second mask pattern comprises a photoresist. Alternatively, another combination may be such that the first mask pattern comprises polycrystalline silicon or amorphous silicon, the thin layer comprises $Si_3N_4$ and the second mask pattern comprises a photoresist. Furthermore, other combinations may be such that the first and second mask patterns comprise polycrystalline silicon or amorphous silicon, and the thin layer comprises $SiO_2$; or such that the first mask pattern comprises $SiO_2$, the thin layer comprises polycrystalline silicon or amorphous silicon, and the second mask pattern comprises a photoresist.

The thin layer and the underlying $SiO_2$ film are etched using the first and second mask patterns so as to expose part of the semiconductor layer which corresponds to the etched portions of the thin layer and the $SiO_2$ film which are located between the first and second mask patterns. The exposed portion of the semiconductor layer is etched by the anisotropic etching method such as reactive ion etching or ion milling to form a trench which has a desired depth. Thereafter, using the first and second mask patterns as masks (if the first and second mask patterns comprise polycrystalline silicon, however, the $SiO_2$ film thereunder is used as a mask), a carrier killer layer may be formed in the bottom of the trench by implanting a material such as an oxide, carbon, or aurum.

A carrier killer layer formed in this fashion has the minority carrier of the semiconductor layer located in the center of its junction, and by placing the minority carrier inside the semiconductor layer variation in the bias of the semiconductor is prevented. With CMOS, for example, by forming the carrier killer layer in the trench (element isolation region) it is possible to prevent latch up and erroneous operation.

In the state where the first and second mask patterns are left, or these mask patterns and the $SiO_2$ film are etched, an insulating material such as $SiO_2$ or $Si_3N_4$ is deposited by the chemical vapor deposition (CVD) method until the trench is completely filled and to cover the entire surface. The insulating material deposited on the semiconductor layer is etched to leave the insulating material in the trench. Thus, the element isolation region is formed. In this case, polycrystalline silicon may be buried in the trench through an insulating film such as a thin $SiO_2$ film, and the polycrystalline silicon exposed on the opening of the trench may be thermally oxidized to form the element isolation region. It is noted that if the impurity is ion-implanted in advance to form a well region, annealing is performed after the element isolation region is formed. Thus, the well region of the conductivity type opposite to that of said semiconductor layer may be formed on the semiconductor layer portion surrounded by the element isolation region.

The thin layer portions formed on at least side surfaces of the first mask pattern are etched using the first and second mask patterns. Furthermore, the $SiO_2$ film under the first and second mask patterns is etched to expose the portion of the semiconductor layer. Since the exposed portion of the semiconductor layer is etched by reactive ion etching or the like, the trench can be formed in self-alignment with the first mask pattern. Furthermore, the width of the trench can be determined by the thickness of the thin layer, so that the width of the trench can be arbitrarily controlled with high precision by changing the thickness of the thin layer. Therefore, although it is difficult to form the element isolation region in units of submicrons with high precision by the conventional photolithography technique, the method for manufacturing a semiconductor device of the present invention can provide a highly precise element isolation region, and hence a highly integrated semiconductor device.

Examples of the present invention will be described with reference to the accompanying drawings.

EXAMPLE 1

A case will be described in Example 1 in which a CMOS-LSI is manufactured on an n-type silicon substrate.

Figure 2A:
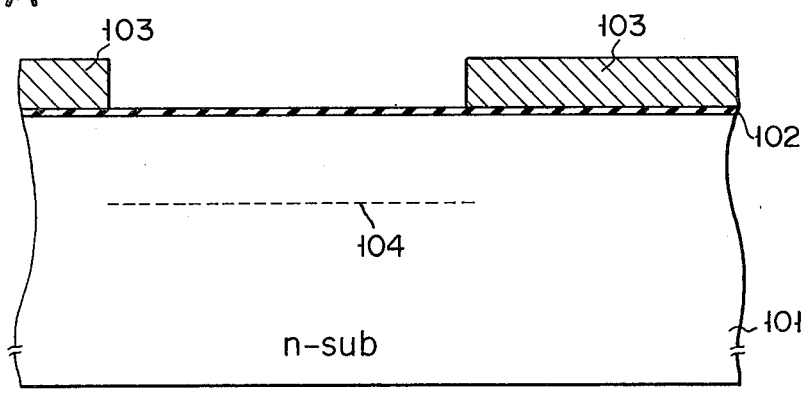
FIGS. 2A to 2L are sectional views for explaining the steps of manufacturing a CMOS-LSI according to a first embodiment of the present invention.

As shown in FIG. 2A, an n-type silicon substrate 101 which had a resistivity of 10 ohms·cm was thermally oxidized to grow a thermal oxide film 102 of 500 Å thickness on the silicon substrate 101. A polycrystalline silicon layer was then deposited by the CVD method on the thermal oxide film 102 to a thickness of 5,000 Å and was patterned by photolithography to form a polycrystalline silicon pattern 103 as the first mask pattern whose opening corresponds to a prospective p-type well region. Subsequently, a p-type impurity (e.g., boron) was ion-implanted in the silicon substrate 101 through the thermal oxide film 102 at a dose of $3 \times 10^{13}$ cm$^{-2}$ and at an acceleration voltage of 160 KeV, using the polycrystalline silicon pattern 103 as a mask. Thus, a boron ion injection layer 104 was formed.

Figure 2B:
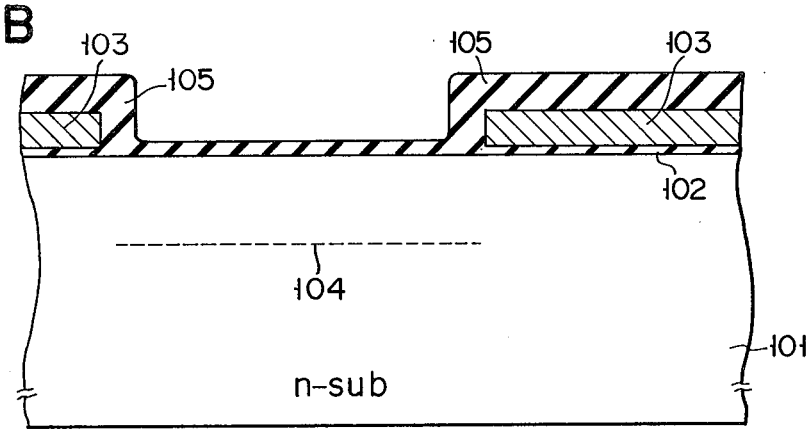

As shown in FIG. 2B, thermal oxidation was performed to form an oxide film 105 as a thin layer which had a thickness of 4,000 Å on the side surfaces and the upper surface of the polycrystalline silicon pattern 103.

Figure 2C:
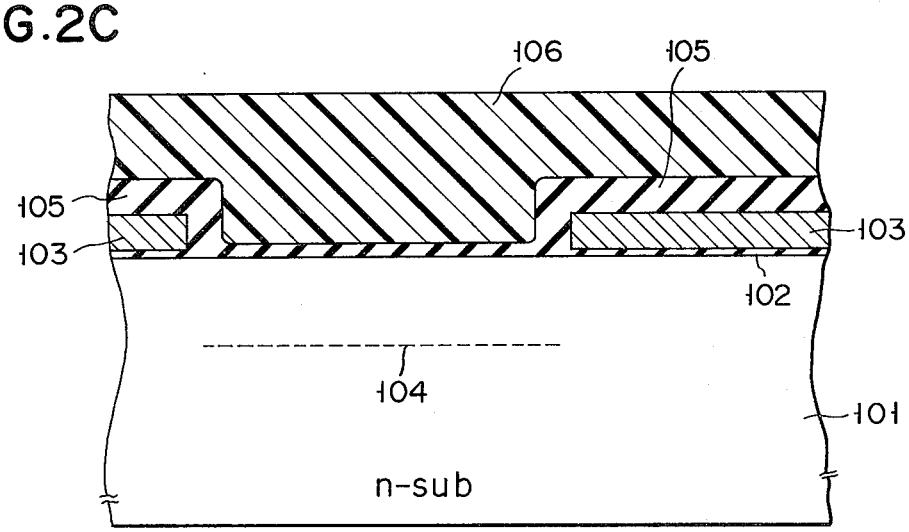
Figure 2D:
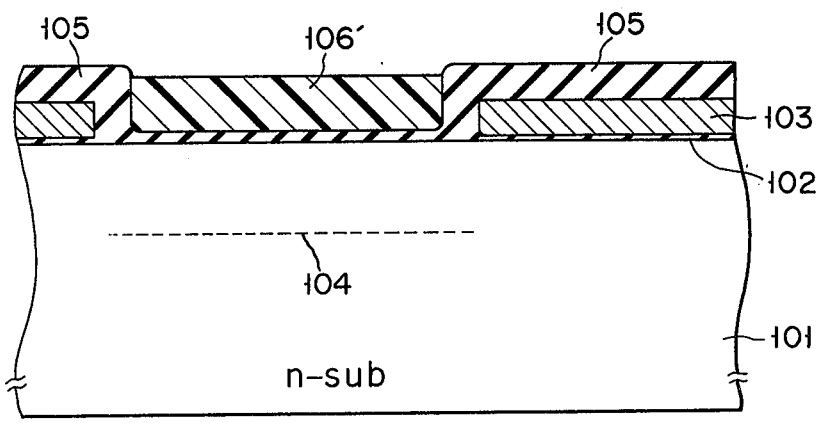

As shown in FIG. 2C, a photoresist film 106 was then coated to cover the entire surface to a thickness of 1.5 μm. The photoresist film 106 was then etched until the oxide film 105 is exposed, thereby forming a photoresist pattern 106' (second mask pattern) which was located on the portion of the thermal oxide film 102 between oxide film portions (of the oxide film 105) left on the side surfaces of the polycrystalline silicon pattern 103, as shown in FIG. 2D.

Figure 2E:
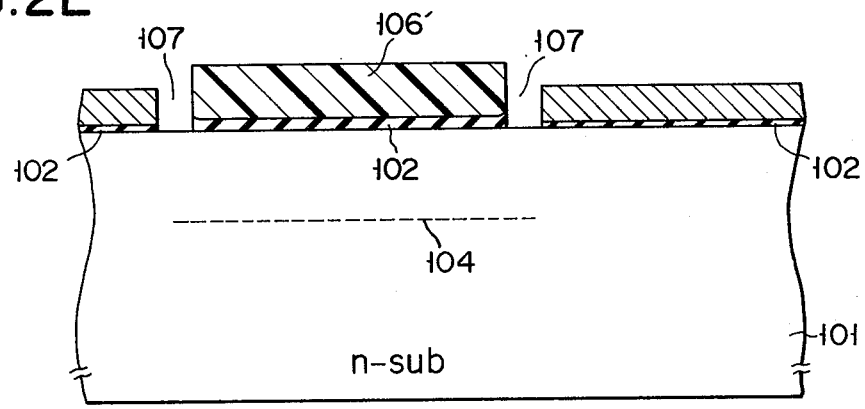
Figure 2F:
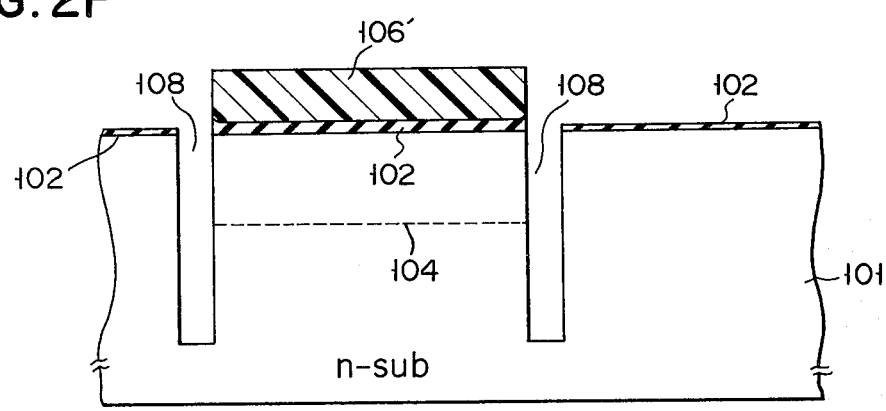

As shown in FIG. 2E, the oxide film portions (of the oxide film 105) on the upper and side surfaces of the polycrystalline silicon pattern 103 and portions of the thermal oxide film 102 under the oxide film portions on the side surfaces of the polycrystalline silicon pattern 103 were etched by anisotropic etching such as reactive ion etching or etching using an etchant of ammonium fluoride. An opening 107 with a small width of 4,000 Å was formed between the photoresist pattern 106' and the polycrystalline silicon pattern 103. Subsequently, as shown in FIG. 2F, an exposed portion of the n-type silicon substrate 101 which was exposed by the opening 107 was etched by reactive ion etching to form a trench 108 which had a width of 0.4 μm and a depth of 5 μm. In the above etching process, although the polycrystalline silicon pattern 103 was etched, the thermal oxide film 102 thereunder functioned as the mask for the silicon substrate 101.

Figure 2G:
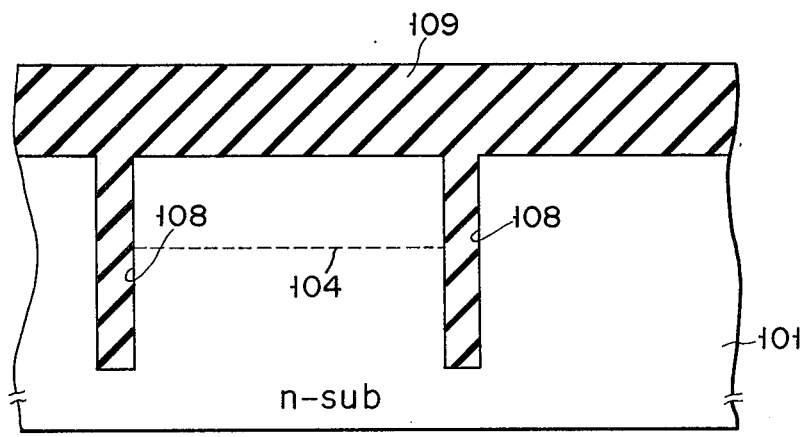
Figure 2H:
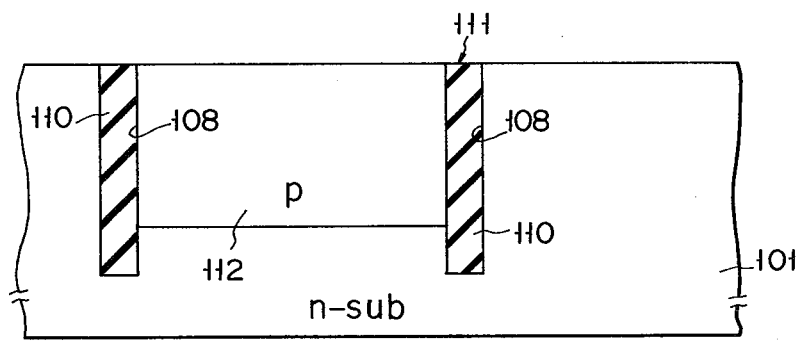
Figure 2I:
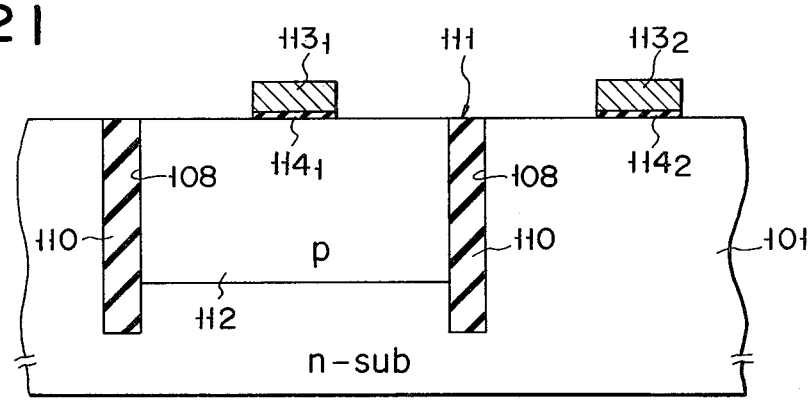

As shown in FIG. 2G, after the photoresist pattern 106' and the thermal oxide film 102 were etched, an SiO$_2$ film 109 was deposited by low-pressure chemical vapor deposition (LPCVD) to cover the entire surface to a thickness greater than half of the width of the opening of the trench 108, that is, to a thickness of 1.5 μm. Thus, the trench 108 was filled with the SiO$_2$ film 109. Thereafter, as shown in FIG. 2H, the SiO$_2$ film 109 was etched to expose the surface of the silicon substrate 101, so that an element isolation region 111 of SiO$_2$ material 110 was formed. Annealing was then performed to diffuse boron from the boron ion injection layer 104 to form a p-type well region 112 which had a resistivity of 50·ohms cm and a depth of 4 μm and which was formed in an island region of the silicon substrate 101. This island region was surrounded by the element isolation region 111.

Thermal oxidation was then performed to form an oxide film (not shown) of 500 Å thickness to cover the entire surface of the silicon substrate 101 including the p-type well region 112. A polycrystalline silicon film (not shown) was deposited by the CVD method on the oxide film to a thickness of 3,000 Å. Arsenic was then ion-implanted into the polycrystalline silicon film to form an arsenic-doped polycrystalline silicon film (not shown). The polycrystalline silicon film was then patterned by photolithography to selectively leave gate electrodes 113$_1$ and 113$_2$ through the oxide film on the p-type well region 112 and the n-type silicon substrate 101. Using the gate electrodes 113$_1$ and 113$_2$ as masks, the oxide film was etched to form gate oxide films 114$_1$ and 114$_2$.

Figure 2J:
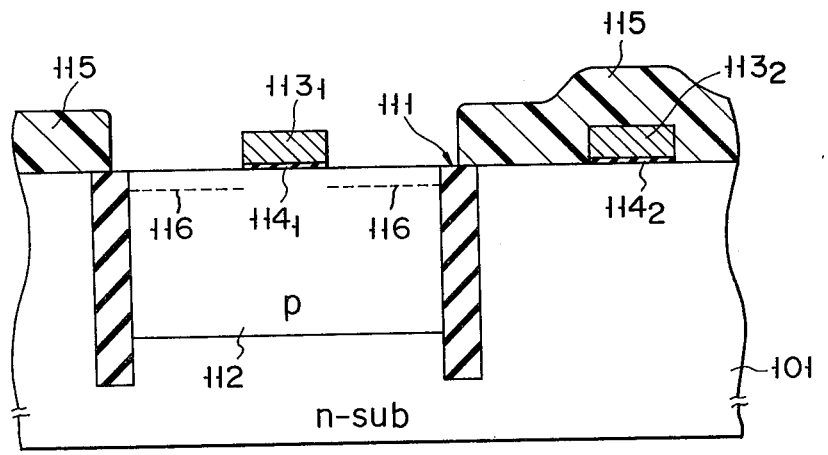
Figure 2K:
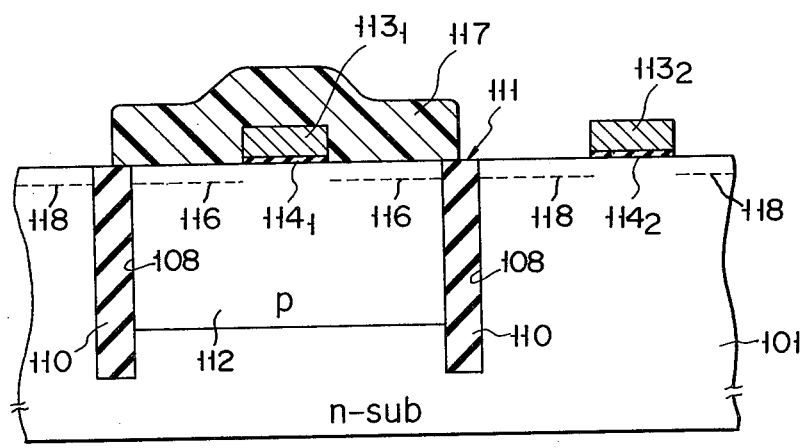

As shown in FIG. 2J, a photoresist pattern 115 was formed to cover the entire surface except for the p-type well region 112. An n-type impurity (e.g., arsenic) was then ion-implanted in the p-type well region 112 at a dose of $2.5 \times 10^{15}$ cm$^{-2}$ and at an acceleration voltage of 40 KeV to form arsenic ion injection layers 116 in the p-type well region 112, using the photoresist pattern 115 and the gate electrode 113 as masks. As shown in FIG. 2K, the photoresist pattern 115 was etched and a photoresist pattern 117 was formed again to cover the surface of the p-type well region 112. A p-type impurity (e.g., boron) was then ion-implanted at a dose of $2 \times 10^{15}$ cm$^{-2}$ and an acceleration voltage of 25 KeV using the photoresist pattern 117 and the gate electrode 113$_2$ as masks. Thus, boron ion injection layers 118 were formed in the n-type silicon substrate 101.

Figure 2L:
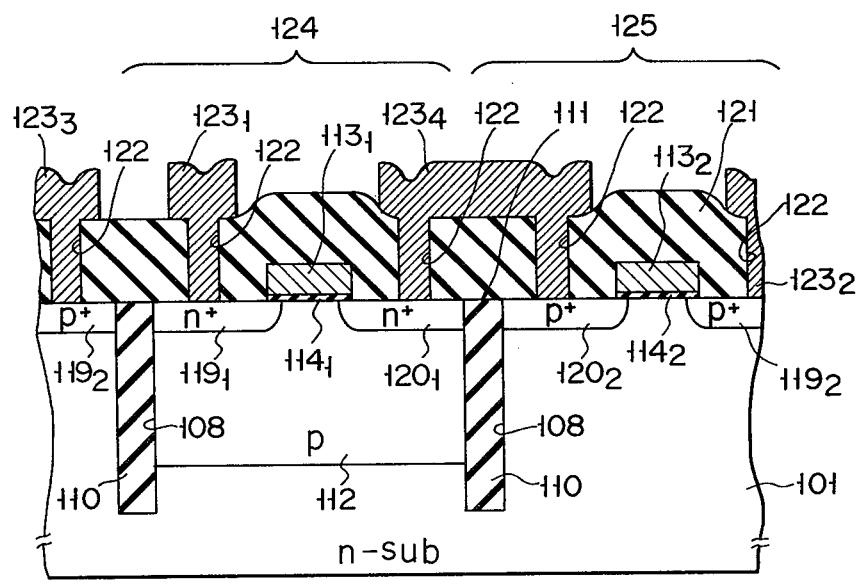

The photoresist pattern 117 was etched, and annealing was performed. Arsenic was diffused from the arsenic ion injection layers 116 and at the same time boron was diffused from the boron ion injection layers 118 to form n$^+$-type source and drain regions 119$_1$ and 120$_1$ in the surface layer of the p-type well region 112, and p$^+$-type source and drain regions 119$_2$ and 120$_2$ in the surface layer of the n-type silicon substrate 101. Thereafter, a CVD-SiO$_2$ film 121 was deposited to cover the entire surface to a thickness of 1.0 μm. Contact holes 122 were formed by photolithography in the CVD-SiO$_2$ film 121, and a metal film (e.g., an aluminum film) was vacuum deposited to cover the entire surface and was patterned. An Al electrode 123$_1$ was connected to the n$^+$-type source region 119$_1$ through the contact hole 122; Al electrodes 123$_2$ and 123$_3$ were respectively connected to the p$^+$-type source regions 119$_2$ through the contact holes 122; and an Al electrode 123$_4$ was commonly connected to the n$^+$-type drain region 120$_1$ and the p$^+$-type drain region 120$_2$ respectively through the contact holes 122. Upon formation of the Al electrodes 123$_1$ to 123$_4$, a CMOS-LSI which comprised an n-channel MOS transistor 124 and a p-channel MOS transistor 125 was prepared, as shown in FIG. 2L.

According to the method for manufacturing the semiconductor device, the oxide film 105 as the thin layer formed on the side surfaces of the polycrystalline silicon pattern 103 as the first mask pattern is etched using the photoresist pattern 106' (second mask pattern). The exposed portion of the thermal oxide film under the oxide film 105 is etched. Furthermore, the exposed portion of the silicon substrate 101 in the opening 107 is etched by reactive ion etching to form the trench 108 which has a small width of 0.4 μm in self-alignment with the polycrystalline silicon pattern 103 as shown in FIG. 2F (the oxide film 102 under the polycrystalline silicon pattern 103). The width of the trench 108 can be determined by the thickness of the oxide film 105 grown on the side surfaces of the polycrystalline silicon pattern 103. Therefore, the thickness of the oxide film 105 is controlled to arbitrarily obtain the small width of the trench and hence of the element isolation region 111. In this manner, although it is difficult to form the element isolation region with high precision in units of submicrons by photolithography, the method for manufacturing the semiconductor substrate of the present invention can provide a highly precise element isolation region 111 and hence a highly integrated CMOS-LSI.

Furthermore, as shown in FIG. 2A, since boron is ion-implanted to form the p-type well region using the polycrystalline silicon pattern 103 as a mask which allows formation of the trench 108 in self-alignment.

Therefore, the element isolation region 111 can be located at the boundary between the silicon substrate 101 and the p-type well region 112 and can be deeper (5 μm) than the p-type well region 112. In the conventional method, as shown in FIG. 1, a space (field oxide film) between a p+-type region 6 and a n+-type region 7 both around the well region must be at least about 12 μm wide to prevent the latch-up phenomenon due to the thyristor which is constituted by the parasitic pnp and npn transistors. However, in the method of the present invention, the space is greatly decreased to units of submicrons. Thus, a highly integrated CMOS-LSI can be obtained.

Furthermore, as shown in FIG. 2H, even if annealing is performed to diffuse boron from the boron ion injection layer 104 to form p-well region 112 after the element isolation region 111 is formed, lateral diffusion which is inherent to the diffusion process can be prevented by the deep element isolation region 11 formed in the silicon substrate 101. Thus, lateral diffusion of the p-well region 112 is substantially zero. This provides a higher integrated CMOS-LSI.

Furthermore, in the method of the present invention, unlike the Locos method, thermal oxidation at a high temperature for a long period of time need not be performed. The size of the trench 108 is kept constant since the $SiO_2$ material 110 is filled in the trench 108, so that the a highly precise element isolation region can be obtained, thus preventing thermal defects of the silicon substrate 101. The field oxide film need not be formed to extend from the surface of the silicon substrate unlike in the conventional Locos method, and the surface thereof becomes smooth, thus providing excellent step coverage of the Al electrodes $123_1$ to $123_4$.

EXAMPLE 2

A case will be described in Example 2 in which a CMOS-LSI is manufactured by using a semiconductor body which comprises an n-type silicon substrate, an n-type epitaxial layer grown on the silicon substrate, and a p+-type buried layer selectively formed at the interface of the silicon substrate and the epitaxial layer.

Figure 3A:
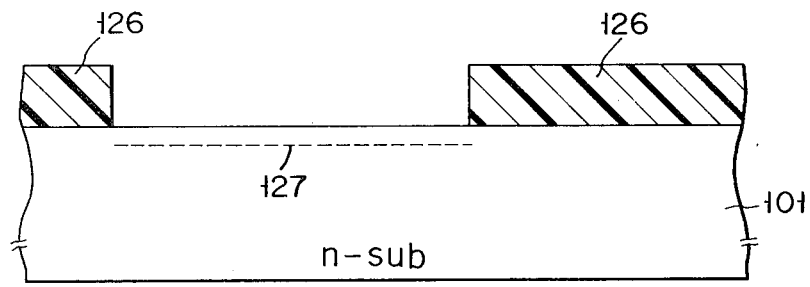
FIGS. 3A to 3H are sectional views for explaining the steps of manufacturing a CMOS-LSI according to a second embodiment of the present invention.

As shown in FIG. 3A, a photoresist pattern 126 was formed on a n-type silicon substrate 101 which had a resistivity of 10 ohms·cm, except for a portion corresponding to a planned n+-type buried layer. A n-type impurity (e.g., arsenic) was then ion-implanted at a dose of $1 \times 10^{13}$ cm$^{-2}$ and at an acceleration voltage of 100 KeV, using the photoresist pattern 126 as a mask. A high-concentration arsenic ion injection layer 127 was selectively formed.

Figure 3B:
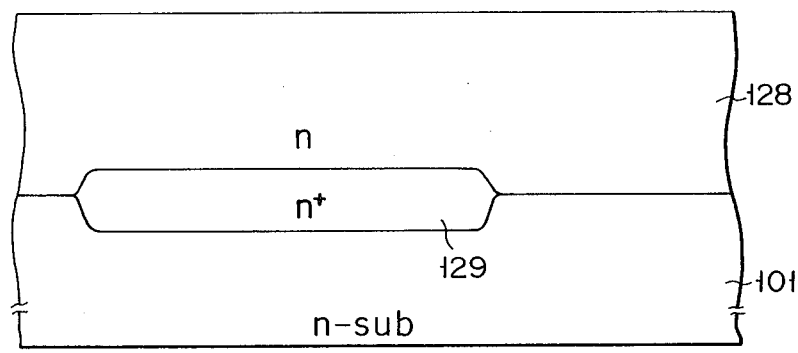

As shown in FIG. 3B, after the photoresist pattern 127 was etched, an n-type epitaxial layer 128 which had a resistivity of 10·ohms cm and a thickness of 4.5 μm was grown on the surface of the silicon substrate 101. By utilizing heat in the epitaxial growth, arsenic was diffused from the boron ion injection layer 127 to selectively form a n+-type buried layer 129 which had a sheet resistance of 7 to 8 ohms/cm$^2$ at the interface between the silicon substrate 101 and the epitaxial layer 128. Thus, a semiconductor body was prepared.

Figure 3C:
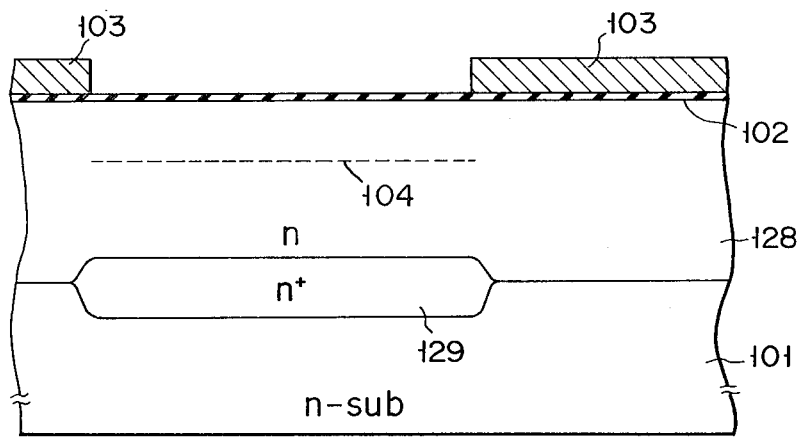

As shown in FIG. 3C, the epitaxial layer 128 was thermally oxidized to grow a thermal oxide film 102 of 500 Å thickness on the surface of the epitaxial layer 128. Thereafter, a polycrystalline silicon layer of 4,000 Å thickness was deposited by the CVD method to cover the entire surface, and was patterned by photolithography to form a polycrystalline silicon pattern 103 as the first mask pattern in which a portion corresponding to the p-type well region was etched. Using the polycrystalline silicon pattern 103 as a mask, a p-type impurity (e.g., boron) was ion-implanted in the epitaxial layer 128 through the thermal oxide film 102 at a dose of $3 \times 10^{13}$ cm$^{-2}$ and at an acceleration voltage of 160 KeV. Thus, a boron ion injection layer 104 was formed.

Figure 3D:
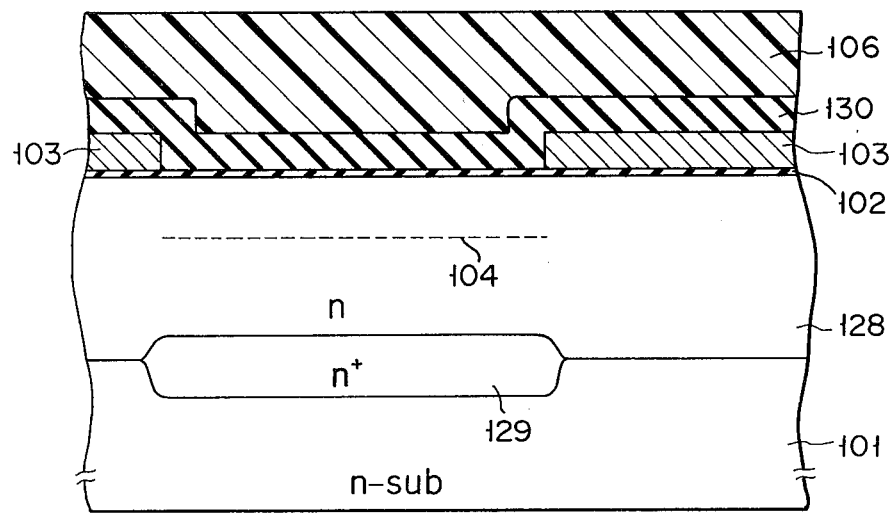

As shown in FIG. 3D, a CVD-$SiO_2$ layer 130 as a thin layer was then deposited to cover the entire surface including the surface of the polycrystalline silicon pattern 103 to a thickness of 4,000 Å. A photoresist film 106 was coated to cover the entire surface to a thickness of 1.5 μm.

Figure 3E:
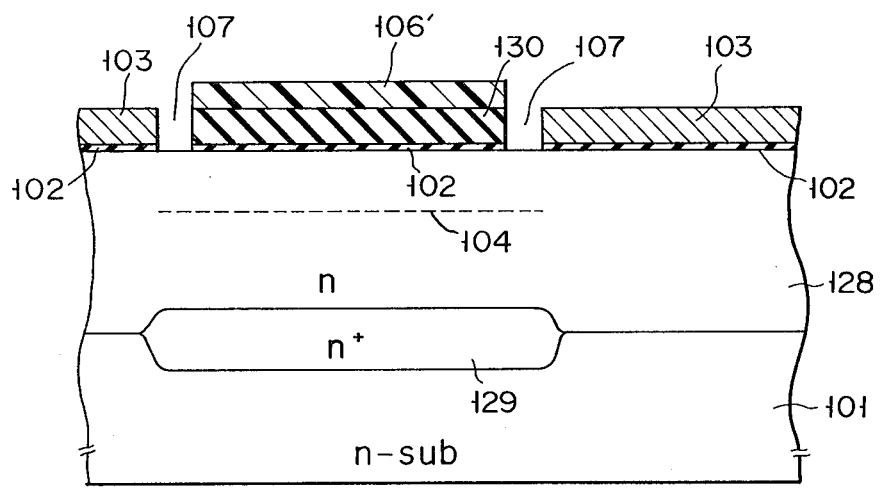

As shown in FIG. 3E, the photoresist film 106 was then etched until the CVD-$SiO_2$ layer 130 on the upper surface of the polycrystalline silicon pattern 103 is exposed, thereby forming a photoresist pattern 106′ (second mask pattern) on a portion of the $SiO_2$ layer 130 which was located on the thermal oxide film 102 between the side surface portions of polycrystalline silicon pattern 103. The portions of the $SiO_2$ layer 130 on the upper and side surfaces of the polycrystalline silicon pattern 103 and portions of the thermal oxide film 102 under the portions of the $SiO_2$ layer 130 formed on the side surfaces of the polycrystalline silicon layer 103 were etched by anisotropic etching such as reactive ion etching or etching using an etchant of ammonium fluoride, using the photoresist pattern 106′ and the polycrystalline silicon pattern 103 as masks. An opening 107 which had a small width of 4,000 Å was formed between the polycrystalline silicon pattern 103 and the photoresist pattern 106′.

Figure 3F:
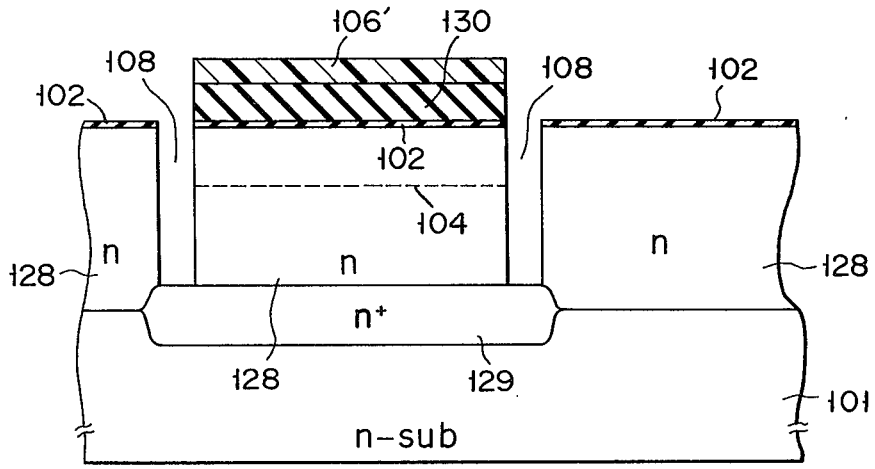

As shown in FIG. 3F, the portion of the epitaxial layer 128 exposed through the opening 107 was etched by reactive ion etching to form an trench 108 which had a bottom reaching the surface of the buried layer 129, a width of 0.4 μm and a depth of about 4.0 μm. In the above etching process, the polycrystalline silicon pattern 103 was etched, and the thermal oxide film 102 thereunder functioned as the mask for the epitaxial layer 128.

Figure 3G:
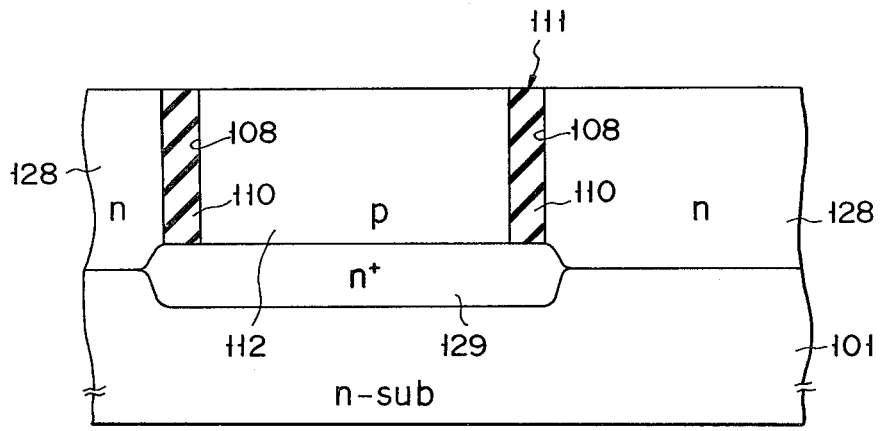

As shown in FIG. 3G, after the photoresist pattern 106′, the $SiO_2$ layer 130 and the thermal oxide film 102 were etched, an $SiO_2$ film 109 was then deposited by the LPCVD method to cover the entire surface to a thickness (e.g., 1.5 μm) greater than half of the width of the opening of the trench 108, so that the $SiO_2$ film 109 was filled completely in the trench 108. The $SiO_2$ film 109 was etched to expose the surface of the epitaxial layer 128 to leave an $SiO_2$ material 110 in the trench 108. Thus, an element isolation region 111 was formed. Annealing was then performed to diffuse boron from the boron ion injection layer 104 to form a p-type well region 112 which had a resistivity of 50·ohms cm and a depth of 4 μm in the epitaxial layer 128 surrounded by the buried layer 129 and the element isolation region 111.

Figure 3H:
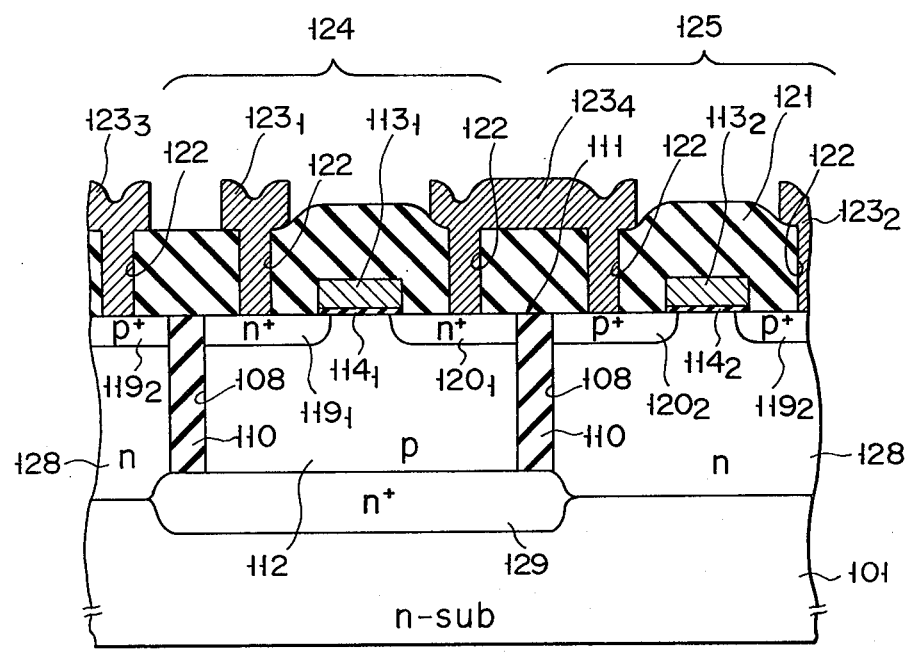

In the same process performed in Example 1, gate electrodes $113_1$ and $113_2$ of arsenic-doped polycrystalline silicon were selectively formed on the surfaces of the p-type well region 112 and the n-type epitaxial layer 128 through gate oxide films $114_1$ and $114_2$. N+-type source and drain regions $119_1$ and $120_1$ were formed in the surface layer of the p-type well region 112; and p+-type source regions $119_2$ and a p+-type drain region $120_2$ were formed in the surface layer of the epitaxial layer 128. An $SiO_2$ film 121 was then deposited to cover the entire surface to a thickness of 1.0 μm. The $SiO_2$ film 121 was then patterned to form contact holes 122. An aluminum film was vacuum deposited and patterned to form an Al electrode $123_1$ which was connected to the $n^+$-type source region $119_1$ through the contact hole 122, Al electrodes $123_2$ and $123_3$ which were respectively connected to the $p^+$-type source regions $119_2$ through the contact holes 122, and an Al electrode $123_4$ which was commonly connected to the $n^+$-type drain region 120 and the $p^+$-type drain region $120_2$ through the contact holes 122. Upon formation of the Al electrodes $123_1$ to $123_4$, a CMOS-LSI which comprised an n-channel MOS transistor 124 and a p-channel MOS transistor 125 was prepared, as shown in FIG. 3H.

According to the method of the present invention in Example 2, the width of the trench 108 to be formed is determined by the thickness of the $SiO_2$ layer 130 deposited to cover the entire surface including the surface of the polycrystalline silicon pattern 103. The thickness of the $SiO_2$ layer 130 is controlled to arbitrarily determine the small width of the trench 108. Thus, the highly precise element isolation region 111 can be formed. In the same manner as in Example 1, a highly integrated CMOS-LSI can be obtained.

Furthermore, the semiconductor body is formed which has the $n^+$-type buried layer 129 selectively formed in the interface between the n-type silicon substrate 101 and the n-type epitaxial layer 128, as shown in FIG. 3B. After the annular trench 108 whose bottom reaches the surface of the buried layer 129 is formed as shown in FIG. 3F, the $SiO_2$ film 110 is filled in the trench 108 to form the element isolation region 111. Furthermore, boron is diffused from the boron ion injection layer 104 which is formed in the epitaxial layer 128 using the polycrystalline silicon pattern 103 as a mask. Thus, the p-type well region 112 is formed such that the bottom thereof is surrounded by the buried layer 129 and the side surfaces thereof are surrounded by the element isolation region 111. As a result, the space surrounding the p-type well region 112 can be decreased to submicron dimensions. At the same time, the latch-up phenomenon can be completely prevented to obtain a highly reliable and highly integrated CMOS-LSI.

EXAMPLE 3

A case will be described in Example 3 in which a CMOS-LSI is manufactured using an SOS (silicon on sapphire) wafer.

Figure 4A:
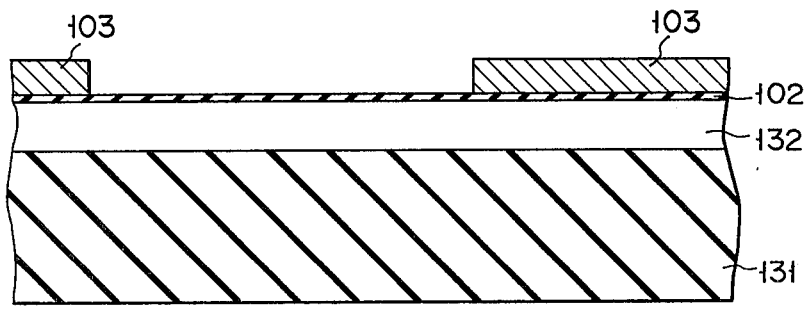
FIGS. 4A to 4H are sectional views for explaining the steps of manufacturing a CMOS-LSI according to a third embodiment of the present invention.

As shown in FIG. 4A, an epitaxial layer 132 which had a resistivity 10 ohms·cm was grown on a sapphire substrate 131 to a thickness of 0.8 μm. The epitaxial layer 132 was then thermally oxidized to grow a thermal oxide film 102 on the surface of the epitaxial layer 132 to a thickness of 500 Å. A polycrystalline silicon layer was then deposited by the CVD method on the thermal oxide film 102 to a thickness of 4,000 Å and was then patterned by photolithography to form a polycrystalline silicon pattern 103 as the first mask pattern.

Figure 4B:
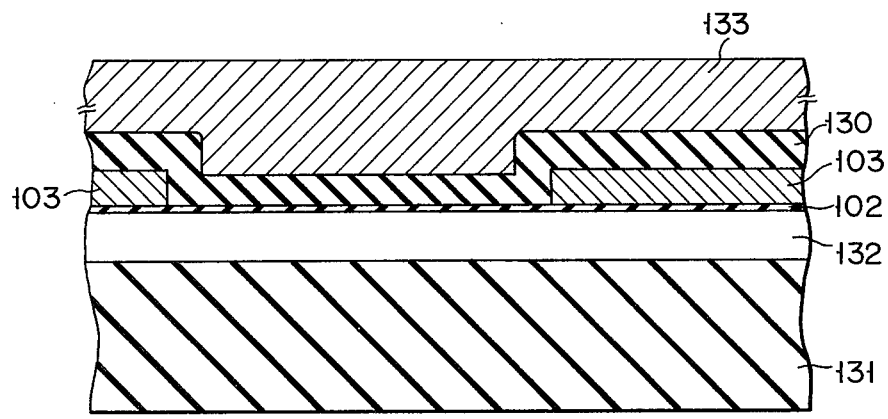

As shown in FIG. 4B, a CVD-$SiO_2$ layer 130 was deposited to cover the entire surface including the surface of the polycrystalline silicon pattern 103 to a thickness of 4,000 Å. A polycrystalline silicon film 133 was then deposited by the CVD method to a thickness of 3.0 μm.

Figure 4C:
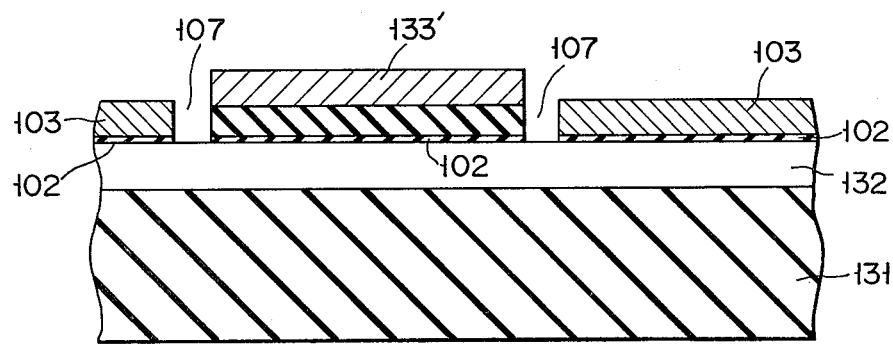

As shown in FIG. 4C, the polycrystalline silicon film 133 was then etched until the CVD-$SiO_2$ film 130 on the upper surface of the polycrystalline silicon pattern 103 is exposed, thereby forming a polycrystalline silicon pattern 133' (second mask pattern) on a portion of the $SiO_2$ layer 130 on the thermal oxide film 102 located between the portions of the $SiO_2$ layer 130 on the side surfaces of the polycrystalline silicon pattern 103. The portions of the $SiO_2$ layer 130 which were formed on the upper and side surfaces of the polycrystalline silicon pattern 103 and portions of the thermal oxide film 102 under the portions of the $SiO_2$ layer 130 formed on the side surface of the polycrystalline silicon pattern 103 were selectively etched by anisotropic etching such as reactive ion etching or etching using an etchant of ammonium fluoride, using the polycrystalline silicon pattern 133' and the polycrystalline silicon pattern 103 as masks. Thus, an opening 107 which had a small width of 4,000 Å was formed between the polycrystalline silicon pattern 103 and the polycrystalline silicon film 133'.

Figure 4D:
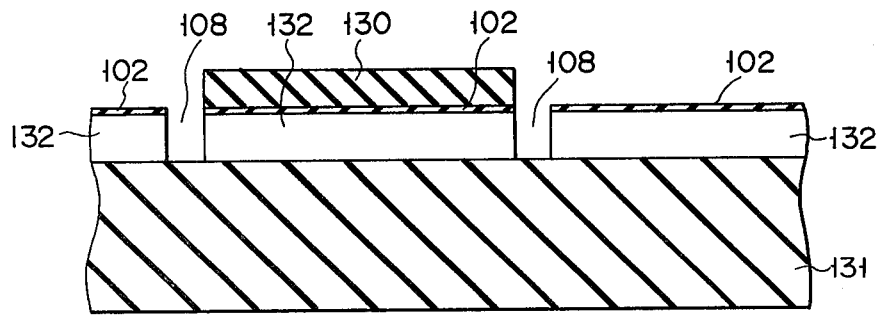

As shown in FIG. 4D, the portion of the epitaxial layer 132 exposed through the opening 107 was etched by reactive ion etching to form an annular ditch 108 which had a bottom reaching the surface of the sapphire substrate 131, a width of 0.4 μm and a depth of 0.8 μm. In the above etching process, the polycrystalline silicon pattern 103 and the polycrystalline silicon pattern 133' were etched, and the remaining portions of the thermal oxide film 102 and the $SiO_2$ layer 130 functioned as masks for the epitaxial layer 132.

Figure 4E:
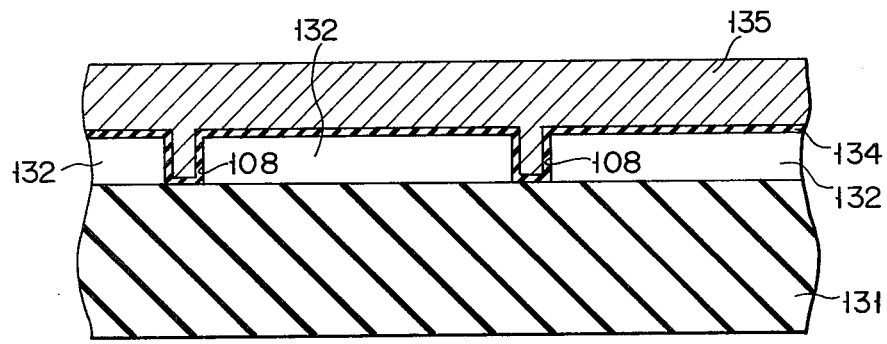
Figure 4F:
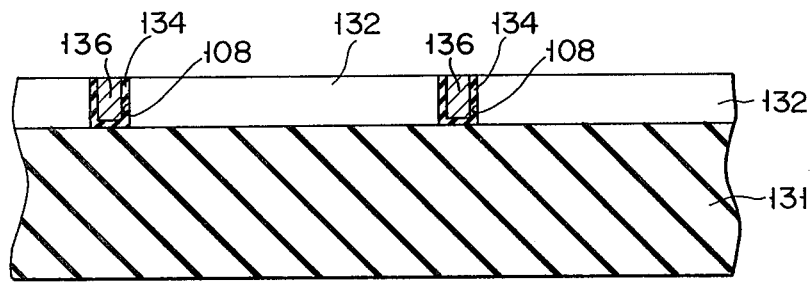
Figure 4G:
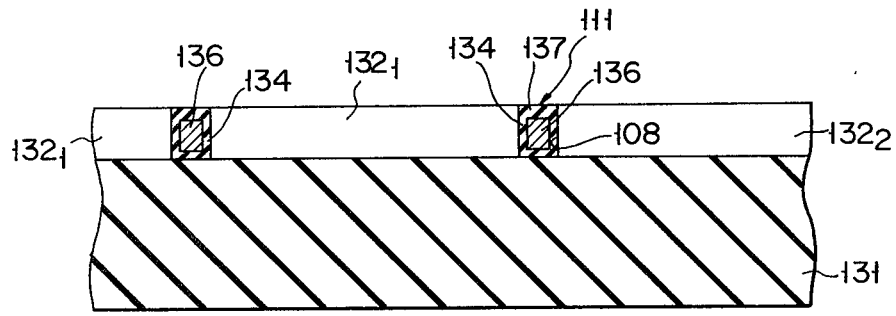
Figure 4H:
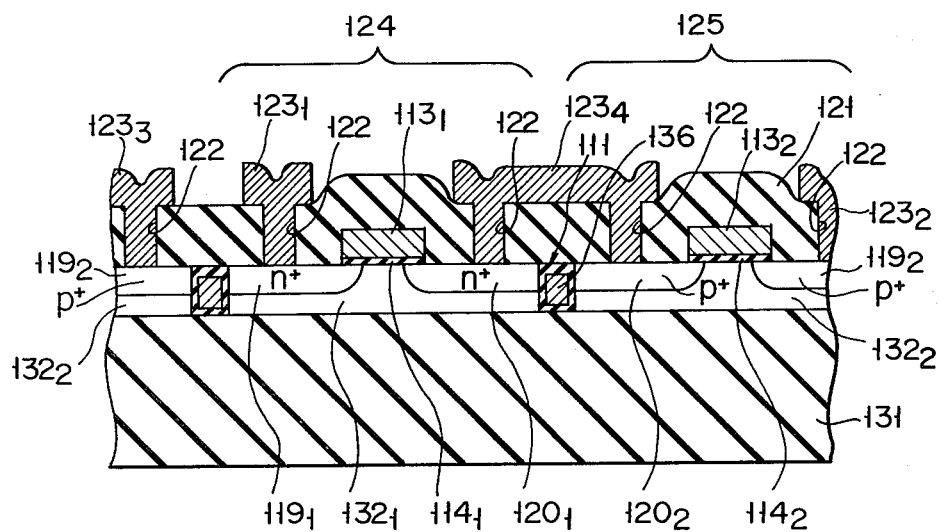

As shown in FIG. 4E, the $SiO_2$ layer 130 and the thermal oxide film 102 were etched, and thermal oxidation was performed to grow a buffer oxide film 134 of 500 Å thickness on the surface of the epitaxial layer 132 and the inner surface of the trench 108. A polycrystalline silicon film 135 was then deposited by the LPCVD method to cover the entire surface to a thickness (e.g., 1.0 μm) greater than half of the width of the opening of the trench 108, so that the trench 108 was completely filled with polycrystalline silicon. Subsequently, as shown in FIG. 4F, the polycrystalline silicon film 135 was then etched to expose the buffer oxide film 134 on the surface of the epitaxial layer 132, and at the same time, a polycrystalline silicon material 136 was left in the trench 108. The buffer oxide film 134 was etched which was formed on the the surface of the epitaxial layer 132 except for the buffer oxide film portions in the trench 108. As shown in FIG. 4G, thermal oxidation was performed to form an oxide film on the surface of the epitaxial layer 132 and on the surface of the polycrystalline silicon material 136 exposed through the opening of the trench 108. The oxide film was selectively etched from the surface of the epitaxial layer 132. Thus, an element isolation region 111 which comprised the polycrystalline silicon material 136 which was buried in the trench 108 through the buffer oxide film 134 and which had the upper surface covered with the oxide film 137. Boron was ion-implanted in a prospective channel region of the island epitaxial layer $132_1$ (n-channel MOS transistor region) isolated by the element isolation region 111. Arsenic was ion-implanted in a prospective channel region of the epitaxial layer $132_2$ (p-channel MOS transistor region) to control the channel.

In the same manner as in Example 1, a highly integrated CMOS-LSI was prepared which comprised an n-channel MOS transistor 124 and a p-channel MOS transistor 125 which were respectively formed on the island epitaxial layers $132_1$ and $132_2$ isolated by the element isolation region 111.

According to the method of the present invention in Example 3, a highly integrated CMOS-LSI is manufactured on the sapphire substrate 131. Since the element isolation region 111 is constituted by the trench 108 formed in the epitaxial layer 132 and the polycrystalline silicon material 136 which is buried in the trench 108 through the buffer oxide film 134 and which has the upper surface covered with the oxide film 137, the difference of thermal expansion between the buried portion in the trench 108 and the epitaxial layer 132 is decreased. Therefore, the mechanical stress of the epitaxial layer 132 which tends to occur in annealing can be controlled. Thus, a CMOS-LSI with excellent electrical characteristics can be obtained.

Unlike the conventional Locos method, thermal oxidation at a high temperature for a long period of time need not be performed. Auto-doping of aluminum from the sapphire substrate 131 can be controlled. Thus, the back channel effect can be eliminated and the highly reliable CMOS-LSI can be obtained.

Figure 5:
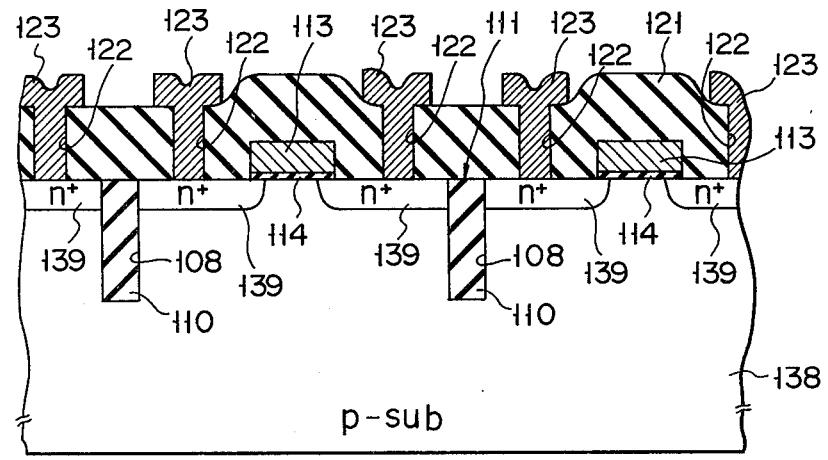
FIG. 5 is a sectional view of an n-channel MOS-LSI according to a fourth embodiment of the present invention.
Figure 6:
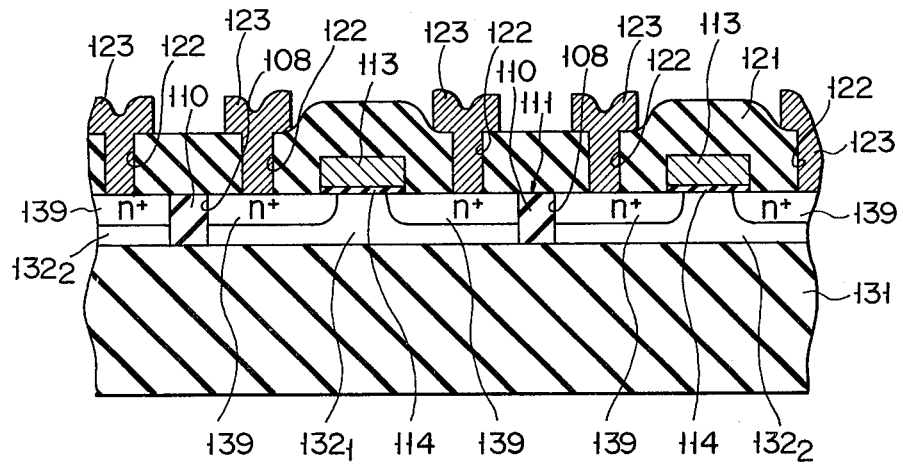
FIG. 6 is a sectional view of an n-channel MOS-LSI according to a fifth embodiment of the present invention.

The method for manufacturing the semiconductor device of the present invention is not limited to the manufacture of the CMOS-LSI (CMOS-IC). As shown in FIGS. 5 and 6, the method of the present invention may also be applied to the manufacture of an n-channel MOS-LSI, a p-channel MOS, and a bipolar-LSI. Referring to FIG. 5, reference numeral 138 denotes a p-type silicon substrate; 111, an element isolation region which comprises a trench 108 and an $SiO_2$ material 110 buried therein; 139, n+-type regions as the source and drain regions which are electrically insulated from each other and which are formed in an island substrate region 138 isolated by the element isolation region 110; 113, gate electrodes of arsenic-doped polycrystalline silicon which are formed in the surface layer of the silicon substrate 137 between the n+-type regions 139 as the source and drain regions respectively through gate oxide films 114; 121, an $SiO_2$ film formed on the silicon substrate 138; and 123, Al electrodes which are connected to the n+-type regions 139 through contact holes 122 and which are deposited on the $SiO_2$ film 121. Referring to FIG. 6, reference numeral 131 denotes a sapphire substrate; $132_1$ and $132_2$, island epitaxial layers which are formed on the sapphire substrate 131 and which are isolated by an element isolation region 111; 139, n+-type regions which function as the source and drain regions and which are electrically insulated from each other and are formed in the surface layers of the epitaxial layers $132_1$ and $132_2$; 113, gate electrodes respectively formed in the surface layers of the epitaxial layers $132_1$ and $132_2$ between the n+-type layers 139 respectively through gate oxide films 114; 121, an $SiO_2$ film formed to cover the entire surface; and 123, Al electrodes which are formed on the $SiO_2$ film 121 and which are respectively connected to the n+-type regions through contact holes 122.

In summary, the trench (element isolation region) which has a desired depth and which has the insulating material buried therein can be formed with high precision in submicron dimensions in self-alignment at the interface between the semiconductor layer (e.g., semiconductor substrate) or a semiconductor substrate and the well region. Thus, a highly integrated semiconductor device can be obtained.

What we claim is:

1. A method for manufacturing a semiconductor device, comprising the steps of:
    forming a $SiO_2$ film on a semiconductor layer;
    laying down a first mask pattern on said $SiO_2$ film;
    using said first mask pattern, ion-implanting in said semiconductor layer an impurity of the conductivity type opposite to that of said semiconductor layer to form an ion injection layer of a conductivity type opposite to that of said semiconductor layer buried in said semiconductor layer;
    forming a thin layer on at least the side surfaces of said first mask pattern;
    selectively forming a second mask pattern on the portion of said $SiO_2$ film located between, and abutting, portions of said thin layer formed on said side surfaces of said first mask pattern, the material of said thin layer being different from the materials of said first and second mask patterns;
    selectively etching said portions of said thin layer formed on at least said side surfaces of said first mask pattern and said $SiO_2$ film under said latter portions and lying between said first and second mask patterns to expose said semiconductor layer;
    selectively etching the exposed portion of said semiconductor layer to form a trench substantially surrounding the implanted ions;
    forming an element isolation region by burying an insulating material in said trench;
    annealing said semiconductor layer to diffuse said impurity from said ion injection layer and thereby forming a well region of a conductivity type opposite to that of said semiconductor layer self-aligned with, and having a depth smaller than the depth of, said element isolation region in that portion of said semiconductor layer isolated by said element region;
    forming an electronic element on said well region; and
    wiring said element for connection.

2. A method according to claim 1, wherein said semiconductor layer is a semiconductor substrate.

3. A method according to claim 1, wherein said semiconductor layer is an epitaxial layer which is formed on a semiconductor substrate of the conductivity type same as that of said epitaxial layer.

4. A method according to claim 1, wherein said semiconductor layer is an epitaxial layer formed on an insulating substrate.

5. A method according to claim 1, wherein said first mask pattern comprises polycrystalline silicon, said thin layer comprises $SiO_2$, and said second mask pattern comprises a photoresist.

6. A method according to claim 1, wherein said first mask pattern comprises polycrystalline silicon, said thin layer comprises $Si_3N_4$, and said second mask pattern comprises a photoresist.

7. A method according to claim 1, wherein said first mask pattern comprises $SiO_2$, said thin layer comprises polycrystalline silicon, and said second mask pattern comprises a photoresist.

8. A method according to claim 1, wherein said first mask pattern comprises $SiO_2$, said thin layer comprises polycrystalline silicon, and said second mask pattern comprises $Si_3N_4$.

9. A method according to claim 1, wherein said first mask pattern which comprises polycrystalline silicon is thermally oxidized to form said thin layer of $SiO_2$ on at least said side surfaces of said first mask pattern.

10. A method according to claim 1, wherein said second mask pattern is formed by forming a photoresist film to cover the entire surface and by etching back said photoresist film.

11. A method according to claim 2 or 3, wherein after said trench is formed, a carrier killer layer is formed in a bottom of said trench in said semiconductor layer by ion-implantation.

12. A method according to claim 11, wherein said carrier killer layer is formed by ion-implanting a material selected from the group consisting of an oxide, carbon and gold.

13. A method according to claim 1, wherein said element isolation region is formed by burying $SiO_2$ in said trench.

14. A method according to claim 1, wherein said element isolation region is formed by burying polycrystalline silicon in said trench through an $SiO_2$ film.

15. A method according to claim 4, wherein a bottom of said element isolation region reaches the top surface of said insulating substrate.

16. A method according to claim 3, including the step of burying a layer of the same conductivity type as said epitaxial layer in the surfaces of said semiconductor substrate and said epitaxial layer.

17. A method according to claim 5 wherein said first mask pattern which comprises polycrystalline silicon is thermally oxidized to form said thin layer of $SiO_2$ on at least said side surfaces of said first mask pattern.

18. A method according to claim 5 wherein said second mask pattern is formed by applying a photoresist film to cover the entire surface of said substrate layer and by etching back said photoresist film.

19. A method according to claim 6 wherein said second mask pattern is formed by applying a photoresist film to cover the entire surface of said substrate layer and by etching back said photoresist film.

20. A method according to claim 7 wherein said second mask pattern is formed by applying a photoresist film to cover the entire surface of said substrate layer and by etching back said photoresist film.

* * * * *